US012689304B2

(12) United States Patent
Yu et al.

(10) Patent No.: US 12,689,304 B2
(45) Date of Patent: Jul. 21, 2026

(54) INVERTER

(71) Applicant: SUNGROW (SHANGHAI) CO., LTD., Shanghai (CN)

(72) Inventors: Haiyang Yu, Shanghai (CN); Ru Wang, Shanghai (CN); Juntao Zhi, Shanghai (CN)

(73) Assignee: SUNGROW (SHANGHAI) CO., LTD., Shanghai (CN)

( * ) Notice: Subject to any disclaimer, the term of this patent is extended or adjusted under 35 U.S.C. 154(b) by 442 days.

(21) Appl. No.: 18/272,872

(22) PCT Filed: Jan. 10, 2022

(86) PCT No.: PCT/CN2022/070909
§ 371 (c)(1),
(2) Date: Jul. 18, 2023

(87) PCT Pub. No.: WO2022/152063
PCT Pub. Date: Jul. 21, 2022

(65) Prior Publication Data
US 2024/0313664 A1      Sep. 19, 2024

(30) Foreign Application Priority Data
Jan. 18, 2021    (CN) .......................... 202120125108.9

(51) Int. Cl.
*H01R 9/24*        (2006.01)
*H02M 7/00*        (2006.01)
*H05K 7/14*        (2006.01)

(52) U.S. Cl.
CPC .......... *H02M 7/003* (2013.01); *H01R 9/2491* (2013.01); *H05K 7/14324* (2022.08)

(58) Field of Classification Search
CPC ....... H01R 9/2491; H01R 9/24; H02M 7/003; H02M 7/5387; H02M 7/00; H05K 7/1432; H05K 7/14324; H05K 7/14; Y02E 10/50
(Continued)

(56) References Cited

U.S. PATENT DOCUMENTS 9,085,242 B2      7/2015  Guillanton et al.
2017/0041443 A1 *  2/2017  Rostami .................. H02J 7/731

FOREIGN PATENT DOCUMENTS

CN        201898452 U      7/2011
CN        202019316 U      10/2011
(Continued)

OTHER PUBLICATIONS

Texas_Instruments-TMX320F28377DPTPT_TI_pp. 1-112_Aug. 2014.*
(Continued)

*Primary Examiner* — Timothy J Thompson
*Assistant Examiner* — Guillermo J Egoavil
(74) *Attorney, Agent, or Firm* — CANTOR COLBURN LLP

(57) ABSTRACT

Provided is an inverter, comprising a conversion module, a delivering module, an inductance module, and a communication module. The delivering module and the inductance module are separately connected to the conversion module by means of plug-in, and the communication module is electrically connected to the delivering module, the conversion module, or the inductance module by means of plug-in. The electrical connection between the modules inside the inverter can be realized by means of plug-in, such that the electrical connection between the modules is more convenient, the working efficiency and maintenance efficiency of electrical connection are improved, and the influence of the electromagnetic interference, which is occurred when the
(Continued)

modules are connected by means of wires, on the working stability of the modules can be avoided, thereby ensuring the working stability of the inverter.

10 Claims, 4 Drawing Sheets

(58) Field of Classification Search
USPC ........................................................ 361/760
See application file for complete search history.

(56) References Cited

FOREIGN PATENT DOCUMENTS

| | | | | | |
|---|---|---|---|---|---|
| CN | 203781551 | U | | 8/2014 | |
| CN | 203851040 | U | | 9/2014 | |
| CN | 204316430 | U | | 5/2015 | |
| CN | 104753100 | A | * | 7/2015 | ............. Y02E 10/50 |
| CN | 204794102 | U | | 11/2015 | |
| CN | 106300999 | A | | 1/2017 | |
| CN | 207117566 | U | | 3/2018 | |
| CN | 208062805 | U | * | 11/2018 | ................ H02J 3/32 |
| CN | 210337612 | U | | 4/2020 | |
| CN | 109936298 | B | * | 2/2021 | ............. H02M 1/14 |
| CN | 112865539 | A | * | 5/2021 | ............ H02M 7/797 |
| DE | 1082957 | B | | 6/1960 | |
| DE | 7606107 | U1 | | 8/1977 | |
| DE | 102013103331 | A1 | | 10/2014 | |
| EP | 0010567 | B1 | | 5/1983 | |
| JP | H06169578 | A | | 6/1994 | |
| JP | H08331865 | A | | 12/1996 | |
| JP | 2004248362 | A | | 9/2004 | |
| JP | 3685391 | B2 | | 6/2005 | |
| JP | 2011145849 | A | | 7/2011 | |
| KR | 101468144 | B1 | | 12/2014 | |
| WO | 2010079916 | A2 | | 7/2010 | |
| WO | 2010079916 | A3 | | 9/2010 | |

OTHER PUBLICATIONS

Tiduay6e (TIDM-HV-1PH-DCAC)_TI_pp. 1 to 50_Mar. 2020.*
TMDSCNCD28377D-Infosheet (controlCARD)_TI_pp. 1-12_May 2014.*
EPO Extended European Search Report for corresponding Application No. EP 22738944.2; Issued Sep. 12, 2024.
JPO Notice of Reasons for Refusal for corresponding JP Application No. 2023-539980; Issued Jun. 20, 2024; 5 pages.
International Search Report for International Application No. PCT/CN2022/070909; Mailing Date, Mar. 16, 2022.

* cited by examiner

INVERTER

CROSS REFERENCE TO RELATED APPLICATIONS

This is the U.S. national stage of application No. PCT/CN2022/070909, filed on Jan. 10, 2022. Priority under 35 U.S.C. § 119(a) and 35 U.S.C. § 365(b) is claimed from Chinese Application No. 202120125108.9 filed Jan. 18, 2021, the disclosure of which is also incorporated herein by reference.

FIELD

The present disclosure relates to the technical field of photovoltaic solar power generation, and in particular to an inverter.

BACKGROUND

A conversion module, a transmission module, an inductor module, and a communication module in a conventional electrical device, especially an inverter, are electrically connected to each other through wires. The wires and the modules in the inverter inside which the wires are arranged is prone to electromagnetic radiation, resulting in poor performance in filtering performed by components of the module and instability transmission through the wires. In addition, the modules are electrically connected to each other through the wires which are inevitably intertwined, resulting in difficulty in organizing and maintaining the wires.

SUMMARY

An inverter is provided according to the present disclosure, so that the electrical connection between modules is simple, thereby improving efficiency in arranging and maintaining the electrical connection as well as protecting the modules from electromagnetic interference. Therefore, the inverter can operate stably.

In order to achieve the objectives, the following technical solutions are provided according to the present disclosure.

An inverter includes a conversion module, a transmission module, an inductor module, and a communication module. The transmission module is plugged in the conversion module. The inductor module is plugged in the conversion module. The communication module is plugged in the transmission module, the conversion module, or the inductor module.

In a preferred embodiment, the conversion module includes a conversion circuit board, a first plug group and a first plug that are arranged on the conversion circuit board. The transmission module includes a transmission circuit board, a second plug group and a second plug that are arranged on the transmission circuit board. The inductor module includes an inductor body and a third plug that are connected to each other. The communication module includes a communication board and a fourth plug that are connected to each other. The first plug group is plugged in the second plug group. The first plug is plugged in the third plug. The second plug is plugged in the fourth plug.

In a preferred embodiment, the first plug group includes a fifth plug and a sixth plug that are arranged on the conversion circuit board. The second plug group includes a seventh plug and an eighth plug that are arranged on the transmission circuit board. The fifth plug is plugged in the seventh plug for electrically connecting the conversion module to the transmission module. The sixth plug is plugged in the eighth plug for communicatively connecting the conversion module to the transmission module.

In a preferred embodiment, the seventh plug includes a plug-in part, and a limiting part surrounding the plug-in part. The plug-in part is plugged in the transmission circuit board. The limiting part abuts against the transmission circuit board. The plug-in part is defined with a through hole. The fifth plug is plugged in the through hole.

In a preferred embodiment, an inner wall of the plug-in hole is provided with multiple protrusions, and the fifth plug abuts against the multiple protrusions.

In a preferred embodiment, the fifth plug is surrounded with multiple protrusions, and the multiple protrusions abut against the through hole.

In a preferred embodiment, the plug-in part tapers at an end plugged in the transmission circuit board.

In a preferred embodiment, the fifth plug includes a plug-in terminal and an abutment part. The abutment part surrounds the plug-in terminal. The plug-in terminal is plugged into the through hole. The plug-in terminal is plugged in the conversion circuit board. The abutment part abuts against the conversion circuit board.

In a preferred embodiment, the plug-in terminal tapers at an end plugged in the conversion circuit board.

In a preferred embodiment, the sixth plug includes a support part and a power strip that are connected to each other. an end of the support part being remote from the power strip is arranged on the conversion circuit board. The eighth plug is defined with a through hole, and the power strip is plugged into the through hole.

In a preferred embodiment, the inverter further includes a connection column. One end of the connection column is connected to the conversion module, and the other end of the connection column is connected to the transmission module.

The present disclosure has the following beneficial effects.

The inverter is provided according to the present disclosure. The transmission module is plugged in the conversion module. The inductor module is plugged in the conversion module. The communication module is plugged in the transmission module, the conversion module, or the inductor module. That is, modules of the inverter are electrically connected to each other without wires or conductive columns, and therefore the electrical connection is simple, thereby greatly improving the efficiency in electrically connecting the modules to each other and maintaining the electrical connections. Further, the modules can be protected from electromagnetic interference, so that the modules can operate stably. Accordingly, the inverter can operate stably.

---

Figure 1:
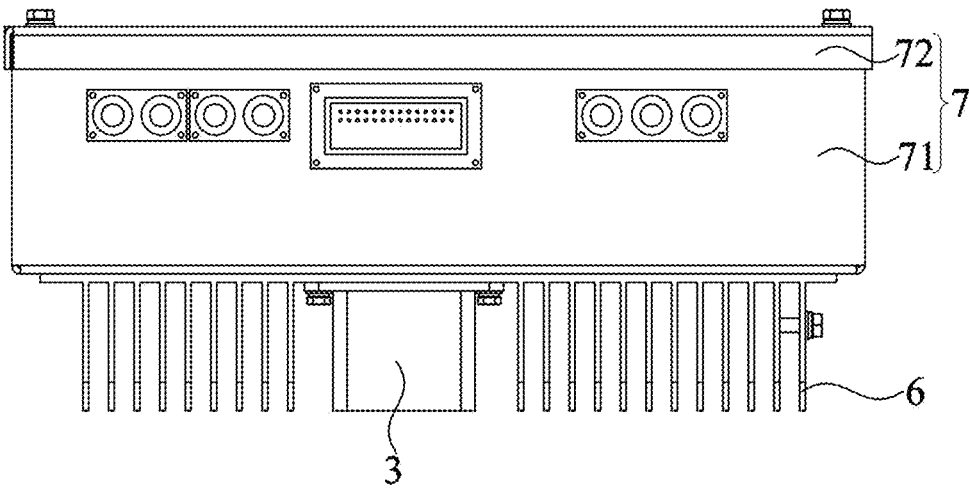
FIG. 1 is a schematic structural diagram illustrating an inverter according to an embodiment of the present disclosure.

In the drawings:

| | |
|---|---|
| 1 conversion module; | 11 conversion circuit board; |
| 111 second mounting hole; | 12 first plug; |
| 13 fifth plug; | 131 plug-in terminal; |
| 1311 plug-in part; | 1312 connection part; |
| 132 abutment part; | 14 sixth plug; |
| 141 support part; | 142 power strip; |
| 2 transmission module; | 21 transmission circuit board; |
| 211 first mounting hole; | 22 second plug; |
| 23 seventh plug; | 231 plug-in part; |
| 2311 through hole; | 23111 protrusion; |
| 232 limiting part; | 24 eighth plug; |
| 241 through hole; | 3 inductor module; |
| 31 inductor body; | 32 third plug; |
| 33 inductor guide plate; | 34 inductor mounting box; |
| 4 communication module; | 41 communication board; |
| 42 fourth plug; | 5 connection column; |
| 6 radiator; | 7 housing; |
| 71 main body; | 72 cover; |
| 8 connection port; | 81 transmission module connection port; |
| 82 communication module connection port. | |

---

DETAILED DESCRIPTION

The technical solutions of the present disclosure are further explained below in conjunction with the drawings and specific embodiments so that the technical problem solved by the present disclosure, the technical solutions recited in the present disclosure and the technical effects achieved by the present disclosure are clear.

In the description of the present disclosure, unless otherwise explicitly specified and defined, terms such as "connect" "link", and "fix" should be understood in a broad sense. For example, one element may be fixed to, detachably connected to, integrally formed with, mechanically connected to, electrically connected to, directly connected to, indirectly connected to, internally communicate with, or interact with another. Those skilled in the art should understand specific meanings of the above terms in the present disclosure based on specific conditions.

In the present disclosure, unless otherwise explicitly specified and defined, the expression that a first feature is located "above" or "below" a second feature indicates that the first feature directly or indirectly contacts with the second feature. Furthermore, the expression that the first feature is located "above", "over" and "on" the second feature indicates that the first feature is located directly or obliquely above the second feature, or simply indicates that the first feature is higher than the second feature. The expression that the first feature is located "below", "under" and "beneath" the second feature indicates that the first feature is located directly or obliquely below the second feature, or simply indicates that the first feature is lower than the second feature.

In the description of the present disclosure, the orientation or positional relationships indicated by terms "up", "down", "left", "right" and the like are based on the orientation or positional relationships shown in the drawings, and are merely for the convenience of the description and simplifying the operations, rather than indicating or implying that the device or element that the term refers to must be in a particular orientation, or be constructed and operated in a particular orientation, and therefore should not be understood as a limitation on the present disclosure. In addition, the terms "first" and "second" are merely used to distinguish two elements in description and have no special meaning.

Figure 2:
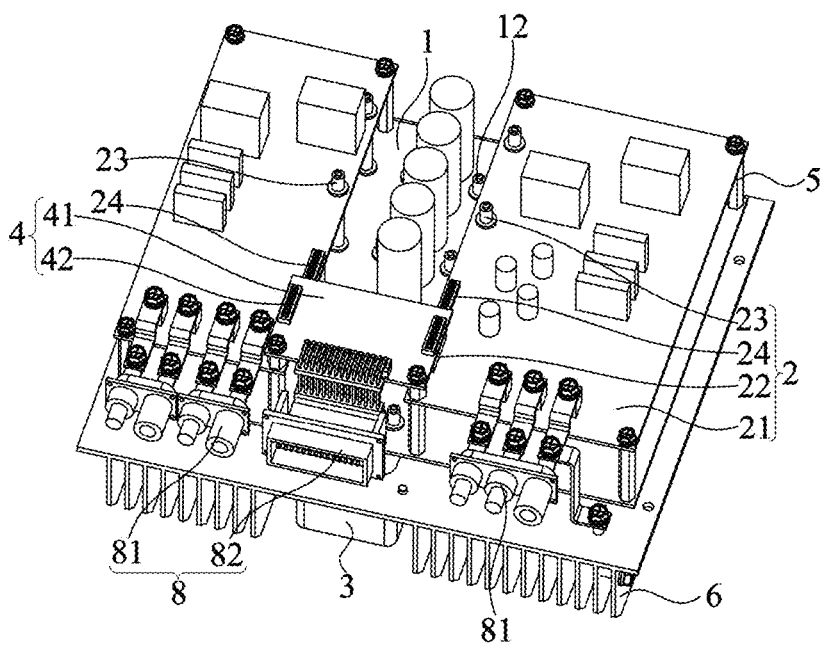
FIG. 2 is a schematic structural diagram illustrating the inverter with its housing not illustrated according to an embodiment of the present disclosure.

As shown in FIG. 1 to FIG. 2, an inverter is provided according to an embodiment. The inverter in the embodiment is mainly a photovoltaic inverter. The photovoltaic inverter is mainly configured to convert a variable direct-current voltage generated by a photovoltaic (PV) solar panel into an alternating-current (AC) voltage with a mains frequency. The alternating-current voltage is then fed back to a commercial transmission system or supplied to an off-grid power grid. The inverter includes a conversion module 1, a transmission module 2, an inductor module 3, and a communication module 4. The transmission module 2 includes a direct-current transmission module and an alternating-current transmission module. The direct-current transmission module is configured to convey variable direct-current power generated by the solar panel. The alternating-current transmission module is configured to convey alternating-current power with the mains frequency acquired through conversion. The conversion module 1 is electrically connected to the direct-current transmission module and the alternating-current transmission module and is configured to convert the variable direct-current power conveyed by the direct-current transmission module into the alternating-current power with the mains frequency and convey the alternating-current power to the alternating-current transmission module. The inductor module 3 is electrically connected to the conversion module 1 and is configured to filter a current so as to stabilize the current. The communication module 4 is electrically connected to the transmission module 2, the conversion module 1, or the inductor module 3, and is configured to communicate with an external device, so that the external device can monitor the inverter.

Preferably, as shown in FIG. 1 to FIG. 2, the inverter further includes a housing 7. The conversion module 1, the transmission module 2, and the communication module 4 are arranged inside the housing 7. The housing 7 has functions of protection and support, to protect the conversion module 1, the transmission module 2, and the communication module 4 from damages. The inductor module 3 is detachably connected to the housing 7 externally, facilitating disassembly and maintenance of the inductor module 3 outside the housing 7. In an embodiment, the housing 7 may be made of sheet metal, and formed by bending or die-casting. The sheet metal housing has strong strength, is easy to repair, has good ageing-resistance performance, and is pollution-free. In other embodiments, the housing 7 is made of plastic, and formed by injection molding, has low cost and is easy to process.

Preferably, as shown in FIG. 1 to FIG. 2, the housing 7 includes a main body 71 and a cover 72. The cover 72 is detachably buckled on the main body 71. The conversion module 1, the transmission module 2, and the communication module 4 are arranged inside the main body 71. When one of the conversion module 1, the transmission module 2, and the communication module 4 malfunctions, the cover 72 is open for inspection and repair.

Preferably, as shown in FIG. 1 to FIG. 2, the inverter further includes a radiator 6. The radiator 6 is fixed to the main body 71. The radiator 6 is configured to cool the conversion module 1, the transmission module 2, the inductor module 3, and the communication module 4, so that the conversion module 1, the transmission module 2, the inductor module 3, and the communication module 4 can normally operate. In an embodiment, the radiator 6 is a finned radiator, and the finned radiator has advantages of high cooling efficiency and a compact structure. In the embodiment, the radiator 6 is made of aluminum alloy, and the aluminum alloy has light weight, high strength, and good cooling effect. The radiator 6 may be integrally formed with the main body 71, facilitating manufacturing. In other embodiments, the radiator 6 is detachably connected to the main body 71, facilitating replacement and repair of the radiator 6 when the radiator 6 malfunctions.

In order to make a structure of the inverter more compact, as shown in FIG. 2, the inductor module 3 passes through the main body 71 and is electrically connected to the conversion module 1 fixed on the main body 71. The direct-current transmission module and the alternating-current transmission module are symmetrically arranged above the conversion module 1 and are electrically connected to the conversion module 1. The communication module 4 is arranged above the direct-current transmission module and the alternating-current transmission module and is electrically connected to the direct-current transmission module and the alternating-current transmission module, so that the inverter has a compact internal structure, the electrical connection between the wires is simple and has a short path.

In order to improve the stability of the connection between the conversion module 1 and the transmission module 2, as shown in FIG. 2, the inverter further includes a connection column 5. One end of the connection column 5 is connected to the conversion module 1, and the other end of the connection column 5 is connected to the transmission module 2. The connection column 5 is configured to support the transmission module 2. In addition, the transmission module 2 and the conversion module 1 are spaced in order to prevent components on the transmission module 2 and components on the conversion module 1 from interfering with each other. The connection column 5 is arranged between the transmission module 2 and the conversion module 1 for limiting and fixing, thereby preventing components on the transmission module 2 and components on the conversion module 1 from interfering with each other. In other embodiments, the transmission module 2 is arranged above the converting module 1, so that the connection column 5 can protect the conversion module 1. Whether the conversion module 1 is arranged above or under the transmission module 2 is not limited in the embodiment. In an embodiment, the connection column 5 is made of steel and is hexagonal in cross-section. Two ends of the connection column 5 are stably screwed to the conversion module 1 and the transmission module 2 (where the connection column is provided with internal threads or external threads), respectively.

Preferably, as shown in FIG. 2, multiple connection columns 5 are arranged between the conversion module 1 and the transmission module 2, and the multiple connection columns 5 are spaced to jointly support the transmission module 2, thereby improving the limiting and fixing performance of the connection columns 5 between the transmission module 2 and the conversion module 1.

Figure 3:
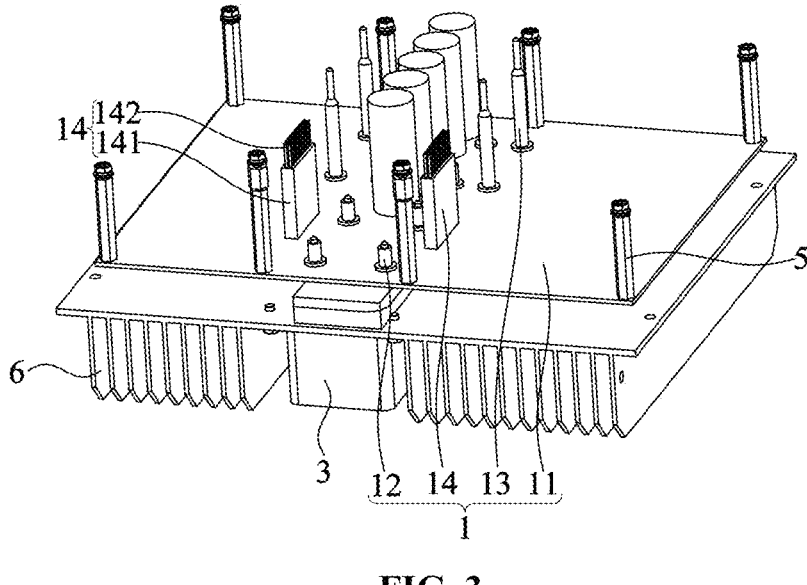
FIG. 3 is a schematic structural diagram illustrating the inverter with its housing and transmission module not illustrated according to an embodiment of the present disclosure.

Details about the inductor module 3 are explained in conjunction with FIG. 3. As shown in FIG. 3, the inductor module 3 includes an inductor body 31 and an inductor mounting box 34. The inductor body 31 is electrically connected to the conversion module 1. The inductor body 31 is arranged in the inductor mounting box 34. The inductor mounting box 34 is fixed to the main body 71. The inductor mounting box 34 is configured to support the inductor body 31 and protect the inductor body 31 from damages.

Preferably, thermal adhesive is arranged between the inductor body 31 and the inductor mounting box 34 in order to improve the performance of cooling the inductor body 31. The thermal adhesive can facilitate cooling of the inductor body 31 so that the inductor body 31 can normally operate. In an embodiment, the terminal adhesive is made of silicone grease. The silicone grease has good thermal conductivity, and therefore is stable and is anti-corrosive at high-temperature.

In order to facilitate the electrical connection between the transmission module 2 and the external device, and the electrical connection between the communication module 4 and the external device, the inverter further includes a connection port 8 as shown in FIG. 2. The main body 71 is defined with a through hole so as to facilitate the arrangement of the connection port 8. The connection port 8 includes a transmission module connection port 81 and a communication module connection port 82. The transmission module 2 is electrically connected to the transmission module connection port 81 through a copper bar so that the external device is electrically connected to the transmission module 2 through the transmission module connection port 81. The communication module 4 is electrically connected to the communication module connection port 82 through a pin header so that the external device is electrically connected to the communication module 4 through the communication module connection port 82. Therefore, the inverter can convert the current.

Preferably, as shown in FIG. 2, a positive pole and a negative pole of the transmission module connection port 81 are provided with a positive pole sign and a negative pole sign respectively in order to distinguish the positive pole from the negative pole, thereby facilitating correct connection of the circuit.

However, in the inverter according to the conventional technology, the electrical connection between the inductor module 3 and the conversion module 1, the electrical connection between the transmission module 2 and the conversion module 1, and the electrical connection between the transmission module 2 and the communication module 4 are through wires. The wires and the modules in the inverter inside which the wires are arranged is prone to electromagnetic radiation, resulting in poor performance in filtering performed by components of the module and instability transmission through the wires. As the development of technology, these modules are electrically connected to each other through conductive columns. However, the modules each are fixed to the conductive column via a fastener so that the modules can be connected to each other through the conductive columns, which is a complex process, resulting in inefficiency in electrically connecting the modules.

As shown in FIG. 2 to FIG. 3, in order to improve the efficiency in electrically connecting the modules in the inverter according to the present disclosure, the transmission module 2 and the inductor module 3 are plugged in the conversion module 1, and the communication module 4 is plugged in the transmission module 2, the conversion module 1, or the inductor module 3. Therefore, it is convenient to electrically connected the modules, thereby improving the efficiency electrically connecting the modules. Further, the modules can be protected from electromagnetic interference, and therefore can operate stably. Accordingly, the inverter can operate stably.

Figure 4:
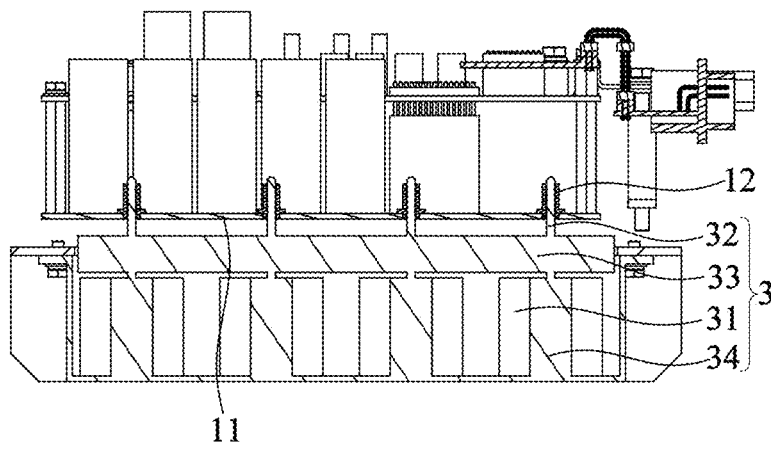
FIG. 4 illustrates a first cross-section of the photovoltaic inverter according to an embodiment of the present disclosure.

Details about one module being plugged in another are described in conjunction with FIG. 2 to FIG. 4. As shown in FIG. 2 to FIG. 4, the conversion module 1 includes a conversion circuit board 11, a first plug group and a first plug 12 arranged on the conversion circuit board 11. The transmission module 2 includes a transmission circuit board 21, a second plug group and a second plug 22 arranged on the transmission circuit board 21. The inductor module 3 further includes a third plug 32, and the third plug 32 is connected to the inductor body 31. The communication module 4 includes a communication board 41 and a fourth plug 42 that are connected to each other. The first plug group is connected to the second plug group, the first plug 12 is connected to the third plug 32, and the second plug 22 is connected to the fourth plug 42. It should be noted that in the embodiment, the communication module 4 is plugged in the transmission module 2.

Specifically, as shown in FIG. 2 to FIG. 4, the first plug group includes a fifth plug 13 and a sixth plug 14 that are arranged on the conversion circuit board 11. The second plug group includes a seventh plug 23 and an eighth plug 24 that are arranged on the transmission circuit board 21. The fifth plug 13 is connected to the seventh plug 23, so that the conversion module 1 is electrically connected to the transmission module 2. The sixth plug 14 is connected to the eighth plug 24, so that the conversion module 1 is communicatively connected to the transmission module 2.

In addition, as shown in FIG. 3, the inductor module 3 further includes an inductor guide plate 33. The inductor guide plate 33 is arranged between the inductor body 31 and the main body 71. The third plug 32 passes through the inductor guide plate 33 and is plugged in the first plug 12. The inductor guide plate 33 guides the third plug 32, thereby effectively preventing the third plug 32, when being plugged in the first plug 12, from shaking. Therefore, the third plug 32 can be plugged in the first plug 12 stably.

Figures 5, 6:
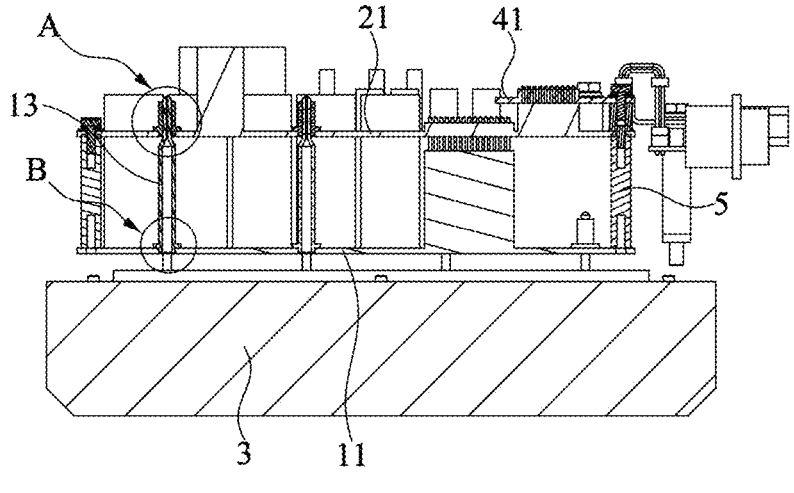
FIG. 5 illustrates a second cross-section of the photovoltaic inverter according to an embodiment of the present disclosure.
FIG. 6 illustrates an enlarged portion denoted A in FIG. 5.
Figures 7, 8:
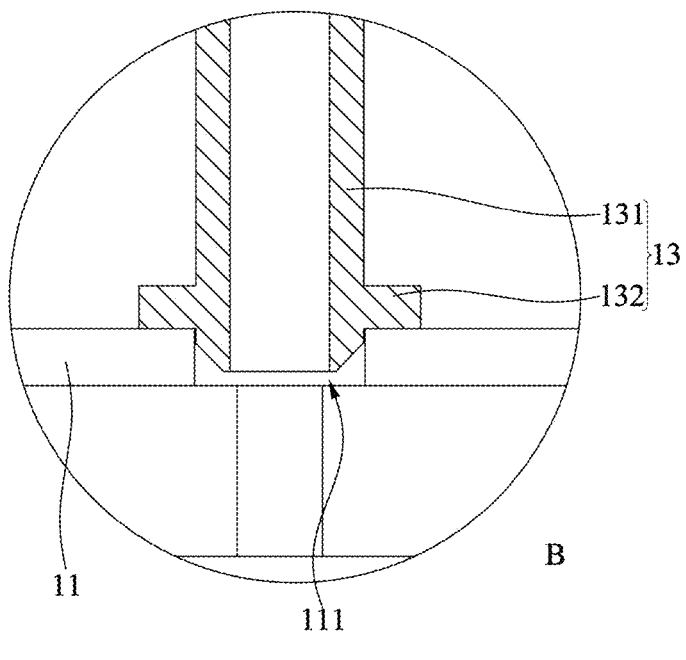
FIG. 7 illustrates an enlarged portion denoted B in FIG. 5.
FIG. 8 illustrates a cross-section of connection between a conversion module and a transmission module according to an embodiment of the present disclosure.

FIG. 5 to FIG. 7 show details that the seventh plug 23 is plugged in the fifth plug 13 so that the conversion module 1 is electrically connected to the transmission module 2. As shown in FIG. 5 to FIG. 7, the seventh plug 23 includes a plug-in part 231 and a limiting part 232 surrounding the plug-in part 231. The plug-in part 231 is plugged in the transmission circuit board 21. The limiting part 232 abuts against the transmission circuit board 21. The plug-in part 231 is defined with a through hole 2311, and the fifth plug 13 is plugged into the through hole 2311. The arrangement of the limiting part 232 increases a contact area between the seventh plug 23 and the transmission circuit board 21, so that the seventh plug 23 can be connected to the transmission circuit board 21 stably. In addition, the plug-in part 231 is plugged in the transmission circuit board 21, which can prevent the seventh plug 23 from shaking on the transmission circuit board 21, thereby preventing the seventh plug 23 on the transmission circuit board 21 being displaced. Therefore, the seventh plug 23 can be stably connected to the transmission circuit board 21. Specifically, the transmission circuit board 21 is defined with a first mounting hole 211, and the plug-in part 231 is plugged into the first mounting hole 211.

Preferably, as shown in FIG. 6, an inner wall of the through hole 2311 is provided with multiple protrusions 23111. The fifth plug 13 abuts against the protrusions 23111, thereby increasing a contact area between the fifth plug 13 and the through hole 2311. Therefore, the fifth plug 13 can be plugged in the seventh plug 23 stably:

Specifically, the multiple protrusions 23111 are spaced along an axis of the inner wall of the through hole 2311, so that the fifth plug 13 contacts with the through hole 2311 evenly. The protrusions 23111 each may be an abutment ring, and the fifth plug 13 is plugged into the abutment ring. Alternatively, the protrusions each may be shaped like a wavy stripe. In an embodiment, the protrusions 23111 each are elastic, so that the fifth plug 13 plugged into the through hole 2311 can be clamped tightly. Therefore, the fifth plug 13 can be stably connected to the seventh plug 23. Details about the protrusions 23111 are not limited in the embodiment, and any solution such that the fifth plug 13 can be stably connected to the seventh plug 23 is applicable to the embodiment.

In another embodiment, the fifth plug 13 is provided with multiple protrusions surrounding the fifth plug 13. The protrusions abut against the through hole 2311, thereby increasing a contact area between the fifth plug 13 and the through hole 2311. Therefore, the fifth plug 13 is stably connected to the seventh plug 23.

Generally, the plug-in part 231 tightly fits the first mounting hole 211 in order to connect the plug-in part 231 to the first mounting hole 211 stably. A diameter of the first mounting hole 211 is not excessively greater than a diameter of the plug-in part 231, so that the plug-in part 231 is difficultly plugged into the mounting hole 211. In this way, the seventh plug 23 can be stably connected to the transmission circuit board 21.

As shown in FIG. 6, the plug-in part 231 tapers at the end plugged in the transmission circuit board 21, in order to facilitate insertion of the plug-in part 231 into the first mounting hole 211.

The limiting part 232 is welded to the transmission circuit board 21 in order to stably connect the seventh plug 23 to the transmission circuit board 21. In another embodiment, the limiting part 232 is screwed or riveted to the transmission circuit board 21, so that the seventh plug 23, when being damaged or poorly connected to the transmission circuit board 21, can be detached from the transmission circuit board 21 for replacement.

FIG. 6 to FIG. 7 show details that the fifth plug 13 is arranged on the conversion circuit board 11. As shown in FIG. 6 to FIG. 7, the fifth plug 13 includes a plug-in terminal 131 and an abutment part 132. The abutment part 132 surrounds the plug-in terminal 131. The plug-in terminal 131 is plugged into the through hole 2311. The plug-in terminal 131 is plugged in the conversion circuit board 11. The abutment part 132 abuts against the conversion circuit board 11.

The abutment part 132 increases a contact area between the fifth plug 13 and the conversion circuit board 11, so that the fifth plug 13 can be stably arranged on the conversion circuit board 11. In addition, the plug-in terminal 131 is plugged in the conversion circuit board 11, which can prevent the fifth plug 13 from shaking on the conversion circuit board 11, thereby preventing the fifth plug 13 from on the conversion circuit board 11 from being displaced. Therefore, the fifth plug 13 can be stably connected to the conversion circuit board 11. In an embodiment, the conversion circuit board 11 is defined with a second mounting hole 111, and the plug-in terminal 131 is plugged into the second mounting hole 111.

As shown in FIG. 7, the end of the plug-in terminal 131 plugged in the conversion circuit board 11 is gradually thin along a direction in which the plug-in terminal 131 is plugged into the second mounting hole 111, in order to facilitate insertion of the plug-in terminal 131 into the second mounting hole 111.

Preferably, as shown in FIG. 6 to FIG. 7, the plug-in terminal 131 includes a plug-in part 1311 and a connection part 1312 that are connected to each other. The plug-in part 1311 is plugged into the through hole 2311. The connection part 1312 is plugged in the conversion circuit board 11. The connection part 1312 is thicker than the plug-in part 1311. The connection part 1312 is configured to support the plug-in part 1311, limit the transmission module 2 and the conversion module 1, and separate the transmission module 2 from the conversion module 1.

In order to stably connect the fifth plug 13 to the conversion circuit board 11, the abutment part 132 is welded to the conversion circuit board 11. In other embodiments, the abutment part 132 is screwed or riveted to the conversion circuit board 11, so that the fifth plug 13, when being damaged or poorly connected to the conversion circuit board 11, can be detached from the conversion circuit board 11 for replacement.

FIG. 8 shows details that the sixth plug 14 is plugged in the eighth plug 24 so that the conversion module 1 is communicatively connected to the transmission module 2. As shown in FIG. 8, the sixth plug 14 includes a support part 141 and a power strip 142 that are connected to each other. An end of the support part 141 being remote from the power strip 142 is arranged on the conversion circuit board 11. The eighth plug 24 is defined with a through hole 241. The power strip 142 is plugged into the through hole 241, so that the conversion module 1 is communicatively connected to transmission module 2.

In addition, the power strip 142, when being plugged into the through hole 241, protrudes from the through hole 241, in order to plug the sixth plug 14 in the eighth plug 24.

It should be noted that details that the first plug 12 is plugged in the third plug 32 so that the conversion module 1 is electrically connected to the inductor module 3 are similar to the details that the seventh plug 23 is plugged in the fifth plug 13 so that the conversion module 1 is electrically connected to the transmission module 2, and therefore are not described herein.

It should further be noted that details that the second plug 22 is plugged in the fourth plug 42 so that the transmission module 2 is communicatively connected to the communication module 4 are similar to the details that the sixth plug 14 is plugged in the eighth plug 24 so that the conversion module 1 is communicatively connected to the transmission module 2, and therefore are not described herein.

Apparently, the above embodiments of the present disclosure are merely examples for clearly illustrating the present disclosure rather than intended to limit the implementation of the present disclosure. For those skilled in the art, other changes or modifications in different forms may be made on the basis of the above description. It is unnecessary and impossible to list all the implementations herein. Any modification, equivalent substitution, and improvement made within the spirit and the principle of the present disclosure shall fall within the protection scope of the present disclosure.

The invention claimed is:

1. An inverter, comprising:
a conversion module (1);
a transmission module (2);
an inductor module (3); and
a communication module (4), wherein
the transmission module (2) is plugged in the conversion module (1), the inductor module (3) is plugged in the conversion module (1), and the communication module (4) is plugged in the transmission module (2), the conversion module (1), or the inductor module (3);
the conversion module (1) comprises a conversion circuit board (11), a first plug group and a first plug (12) that are arranged on the conversion circuit board (11);
the transmission module (2) comprises a transmission circuit board (21), a second plug group and a second plug (22) that are arranged on the transmission circuit board (21);
the inductor module (3) comprises an inductor body (31) and a third plug (32) that are connected to each other; and
the communication module (4) comprises a communication board (41) and a fourth plug (42) that are connected to each other, wherein the first plug group is plugged in the second plug group, the first plug (12) is plugged in the third plug (32), and the second plug (22) is plugged in the fourth plug (42).

2. The inverter according to claim 1, wherein
the first plug group comprises a fifth plug (13) and a sixth plug (14) that are arranged on the conversion circuit board (11); and
the second plug group comprises a seventh plug (23) and an eighth plug (24) that are arranged on the transmission circuit board (21), wherein the fifth plug (13) is plugged in the seventh plug (23) for electrically connecting the conversion module (1) to the transmission module (2), and the sixth plug (14) is plugged in the eighth plug (24) for communicatively connecting the conversion module (1) to the transmission module (2).

3. The inverter according to claim 2, wherein
the seventh plug (23) comprises a plug-in part (231), and a limiting part (232) surrounding the plug-in part (231), wherein the plug-in part (231) is plugged in the transmission circuit board (21), the limiting part (232) abuts against the transmission circuit board (21), the plug-in part (231) is defined with a through hole (2311), and the fifth plug (13) is plugged in the through hole (2311).

4. The inverter according to claim 3, wherein
an inner wall of the through hole (2311) is provided with a plurality of protrusions (23111), and the fifth plug (13) abuts against the plurality of protrusions (23111).

5. The inverter according to claim 3, wherein
the fifth plug (13) is surrounded with a plurality of protrusions, and the plurality of protrusions abut against the through hole (2311).

6. The inverter according to claim 3, wherein
the plug-in part (231) tapers at an end plugged in the transmission circuit board (21).

7. The inverter according to claim 3, wherein
the fifth plug (13) comprises a plug-in terminal (131) and an abutment part (132), the abutment part (132) surrounds the plug-in terminal (131), the plug-in terminal (131) is plugged into the through hole (2311), the plug-in terminal (131) is plugged in the conversion circuit board (11), and the abutment part (132) abuts against the conversion circuit board (11).

8. The inverter according to claim 7, wherein
the plug-in terminal (131) tapers at an end plugged in the conversion circuit board (11).

9. The inverter according to claim 3, wherein
the sixth plug (14) comprises a support part (141) and a power strip (142) that are connected to each other, an end of the support part (141) being remote from the power strip (142) is arranged on the conversion circuit board (11), the eighth plug (24) is defined with a through hole (241), and the power strip (142) is plugged into the through hole (241).

10. The inverter according to claim 1, further comprising:

a connection column (5), wherein one end of the connection column (5) is connected to the conversion module (1), and the other end of the connection column (5) is connected to the transmission module (2).

* * * * *